(12) United States Patent
Cok et al.

(10) Patent No.: US 7,521,270 B2
(45) Date of Patent: Apr. 21, 2009

(54) OLED PATTERNING METHOD

(75) Inventors: Ronald S. Cok, Rochester, NY (US); Christopher B. Rider, Hardwick (GB)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/676,323

(22) Filed: Feb. 19, 2007

(65) Prior Publication Data

US 2008/0199984 A1    Aug. 21, 2008

(51) Int. Cl.
*H01L 33/00*    (2006.01)

(52) U.S. Cl. ............... 438/22; 438/47; 313/506; 445/25; 257/E33.001

(58) Field of Classification Search ........... 257/E33.001
See application file for complete search history.

(56) References Cited

U.S. PATENT DOCUMENTS

| | | | |
|---|---|---|---|
| 4,476,292 A | 10/1984 | Ham et al. | |
| 4,769,292 A | 9/1988 | Tang et al. | |
| 4,879,451 A * | 11/1989 | Gart | 219/121.69 |
| 5,247,190 A | 9/1993 | Friend et al. | |
| 5,522,963 A | 6/1996 | Anders, Jr. et al. | |
| 5,693,962 A * | 12/1997 | Shi et al. | 257/89 |
| 5,937,272 A * | 8/1999 | Tang | 438/30 |
| 6,168,910 B1 * | 1/2001 | Hino et al. | 430/328 |
| 6,392,340 B2 | 5/2002 | Yoneda et al. | |
| 6,703,298 B2 | 3/2004 | Roizin et al. | |
| 2005/0158668 A1* | 7/2005 | Bittner et al. | 430/322 |
| 2006/0283539 A1 | 12/2006 | Slafer | |
| 2007/0077849 A1* | 4/2007 | Chen et al. | 445/25 |
| 2008/0001536 A1* | 1/2008 | Tsai et al. | 313/506 |

FOREIGN PATENT DOCUMENTS

| | | | |
|---|---|---|---|
| JP | 2001313287 A | * | 11/2001 |
| WO | 2006/111766 | | 10/2006 |

OTHER PUBLICATIONS

"Organic Electroluminescent Diodes", by Tang et al., Applied Physics Letters, Sep. 21, 1987, pp. 913-915.
"Electroluminescence of doped organic thin films", by Tang et al., Journal of Applied Physics, May 1, 1989, pp. 3610-3616.

* cited by examiner

*Primary Examiner*—W. David Coleman
*Assistant Examiner*—Shaka Scarlett
(74) *Attorney, Agent, or Firm*—Stephen H. Shaw; Raymond L. Owens (57) ABSTRACT

A method of forming a patterned, light-emitting device that includes mechanically locating a first masking film over a substrate; forming first openings in first locations in the masking film; and depositing first light-emissive materials over the substrate through the first openings in the first masking film. Subsequent steps include mechanically removing the first masking film; mechanically locating a second masking film over the substrate in a position that prevents particulate contamination in the first locations; and forming second openings in the second masking film. The second openings are in different locations over the substrate than the first openings. The first locations are protected from particulate contamination resulting from the formation of the second openings. Additional steps include depositing second light-emissive materials over the substrate through the second openings in the second masking film; and mechanically removing the second masking film.

20 Claims, 10 Drawing Sheets

OLED PATTERNING METHOD

FIELD OF THE INVENTION

The present invention relates to light-emitting devices, and more particularly, to a method for depositing OLED materials in a pattern over a substrate.

BACKGROUND OF THE INVENTION

Organic light-emitting diodes (OLEDs) are a promising technology for flat-panel displays and area illumination lamps. The technology relies upon thin-film layers of organic materials coated upon a substrate. OLED devices generally can have two formats known as small molecule devices such as disclosed in U.S. Pat. No. 4,476,292, issued Oct. 9, 1984, by Ham et al., and polymer OLED devices such as disclosed in U.S. Pat. No. 5,247,190, issued Sep. 21, 1993, by Friend et al. Either type of OLED device may include, in sequence, an anode, an organic EL element, and a cathode. The organic EL element disposed between the anode and the cathode commonly includes an organic hole-transporting layer (HTL), an emissive layer (EL) and an organic electron-transporting layer (ETL). Holes and electrons recombine and emit light in the EL layer. Tang et al. (Applied Physics Letter, 51, 913 (1987), Journal of Applied Physics, 65, 3610 (1989), and U.S. Pat. No. 4,769,292, issued Sep. 6, 1988) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer and the hole transport layer and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EL can determine how efficiently the electrons and holes be recombined and result in the emission of light, etc.

A typical OLED device uses a glass substrate, a transparent conducting anode such as indium-tin-oxide (ITO), a stack of organic layers, and a reflective cathode layer. Light generated from such a device may be emitted through the glass substrate. This is commonly referred to as a bottom-emitting device. Alternatively, a device can include a substrate, a reflective anode, a stack of organic layers, and a top transparent electrode layer. Light generated from such an alternative device may be emitted through the top transparent electrode. This is commonly referred to as a top-emitting device.

OLED devices can employ a variety of light-emitting organic materials patterned over a substrate that emit light of a variety of different frequencies, for example red, green, and blue, to create a full-color display. For small molecule organic materials, such patterned deposition is done by evaporating materials and is quite difficult, requiring, for example, expensive metal shadow-masks. Each mask is unique to each pattern and device design. These masks are difficult to fabricate and must be cleaned and replaced frequently. Material deposited on the mask in prior manufacturing cycles may flake off and cause particulate contamination. Moreover, aligning shadow-masks with a substrate is problematic and often damages the materials already deposited on the substrate. Further, the masks are subject to thermal expansion during the OLED material deposition process, reducing the deposition precision and limiting the resolution and size at which the pattern may be formed.

Alternatively, it is known to employ a combination of emitters, or an unpatterned broad-band emitter, to emit white light together with patterned color filters, for example red, green, and blue, to create a full-color display. The color filters may be located on the substrate, for a bottom-emitter, or on the cover, for a top-emitter. For example, U.S. Pat. No. 6,392,340 entitled "Color Display Apparatus Having Electroluminescence Elements" issued May 21, 2002, by Yoneda et al., illustrates such a device. However, such designs are relatively inefficient since approximately two thirds of the light emitted may be absorbed by the color filters.

The use of polymer, rather than metal, masks is known in the prior art. For example, WO2006/111766, published Oct. 26, 2006, by Speakman et al., describes a method of manufacturing comprising a applying a mask to substrate; forming a pattern in the mask; processing the substrate according to the pattern; and mechanically removing the mask from the substrate. A method of manufacturing an integrated circuit is also disclosed. However, this method creates significant particulate contamination that can deleteriously affect subsequent processing steps, for example the deposition of materials or encapsulation of a device. Moreover, subsequent location of a mask over a previously patterned area may damage materials in the previously patterned area.

Patterning a flexible substrate within a roll-to-roll manufacturing environment is also known and described in US2006/0283539, published Dec. 21, 2006, by Slafer et al. However, such a method is not readily employed with multiply patterned substrates employing evaporated deposition. Disposable masks are also disclosed in U.S. Pat. No. 5,522,963, issued Jun. 4, 1996, by Anders, Jr. et al., and a process of laminating a mask to a ceramic substrate described. However, the process of registering a mask to the substrate is limited in registration and size. A self-aligned process is described in U.S. Pat. No. 6,703,298, issued Mar. 9, 2004, by Roizin et al., for making memory cells. A sputtered disposable mask is patterned and removed by etching. However, as with the prior-art disclosures cited above, the formation of the mask and its patterning with multiple masking, deposition, and processing steps, are not compatible with delicate, especially organic, materials such as are found in OLED displays.

There is a need, therefore, for an improved method for patterning organic light-emitting diode materials that improves resolution and efficiency, reduces damage to underlying layers, reduces particulate contamination, and reduces manufacturing costs.

SUMMARY OF THE INVENTION

In accordance with one embodiment that addresses the aforementioned need, the present invention is directed towards a method of forming a patterned, light-emitting device that includes mechanically locating a first masking film over a substrate; forming first openings in first locations in the masking film; and depositing first light-emissive materials over the substrate through the first openings in the first masking film. Subsequent steps include mechanically removing the first masking film; mechanically locating a second masking film over the substrate in a position that prevents particulate contamination in the first locations; and forming second openings in the second masking film. The second openings are in different locations over the substrate than the first openings. The first locations are protected from particulate contamination resulting from the formation of the second openings. Additional steps include depositing second light-emissive materials over the substrate through the second openings in the second masking film; and mechanically removing the second masking film.

ADVANTAGES

The method of the present invention has the advantage that it improves resolution and efficiency, reduces damage to underlying layers, reduces particulate contamination, and reduces manufacturing costs for an OLED device.

It will be understood that the figures are not to scale since the individual components have too great a range of sizes and thicknesses to permit depiction to scale.

DETAILED DESCRIPTION OF THE INVENTION

Figure 1:
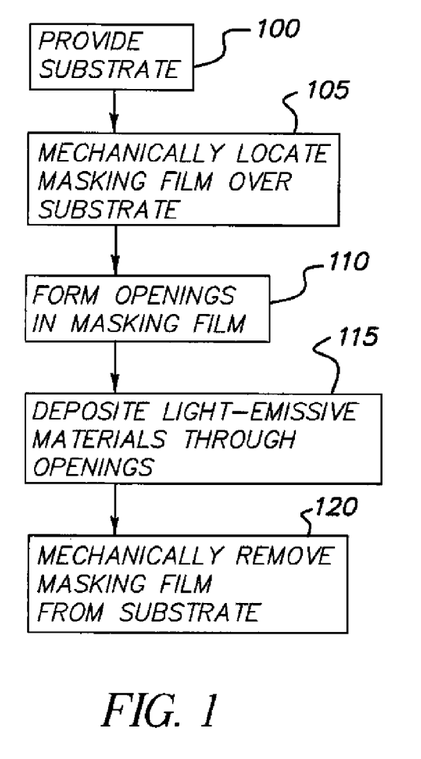
FIG. 1 is a flow chart illustrating a method of forming a patterned, light-emitting device according to one embodiment of the present invention.

Referring to FIG. 1, in accordance with one embodiment of the present invention, a method of forming a patterned, light-emitting device, comprises the steps of providing a substrate 100, mechanically locating a masking film over the substrate 105, forming openings in the masking film 110, depositing light-emissive materials over the substrate through the openings in the masking film 115, and mechanically removing the masking film 120.

Figure 2:
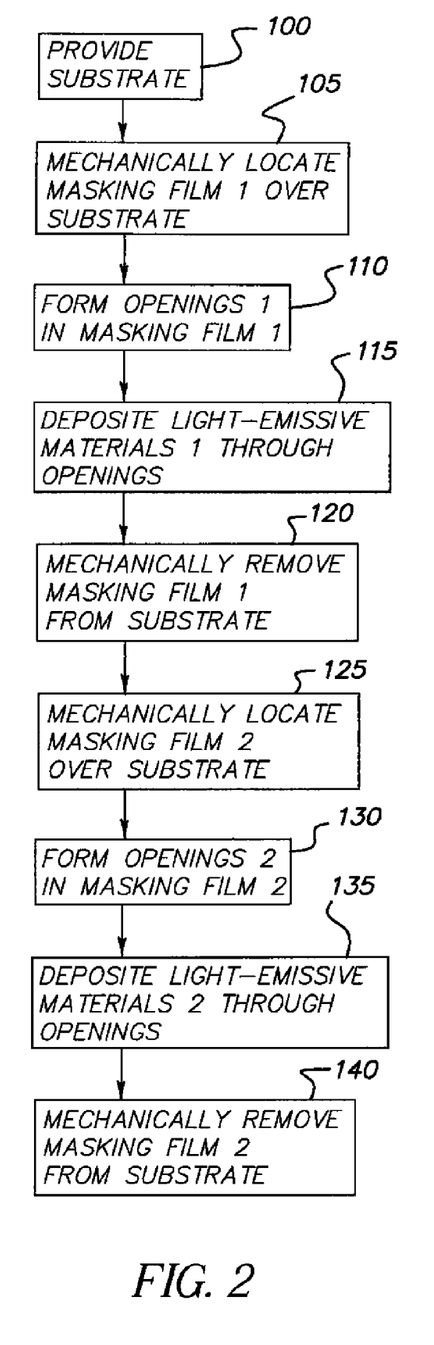
FIG. 2 is a flow chart illustrating a method of forming a patterned, light-emitting device according to an alternative embodiment of the present invention.

Referring to FIG. 2, in a further embodiment of the method of the present invention, a second masking film may be provided and mechanically located over the substrate 125. Openings may be formed 130 in the second masking film and light-emissive materials deposited 135 over the substrate through the openings in the second masking film. Finally, the second masking film may be mechanically removed 140. The steps in which the masking films are located 105, 125, and removed 120, 140 may be identical. The masking film itself may also be identical. However, in most embodiments of the present invention, the openings in the masking film may be formed in different locations so that different light-emissive materials may be deposited in the different locations over the substrate 10. Moreover, more than one light-emissive material may be deposited through the openings, as may other materials, and the materials may be formed in layers over the same location on the substrate 10 as the light-emissive materials. For example, the light-emissive materials may comprise a plurality of light-emitting layers. The light-emissive materials may be organic materials comprising a small-molecule or polymer molecule light-emitting diodes. Alternatively, the light-emissive materials may be inorganic and comprise, for example, quantum dots.

Figure 3:
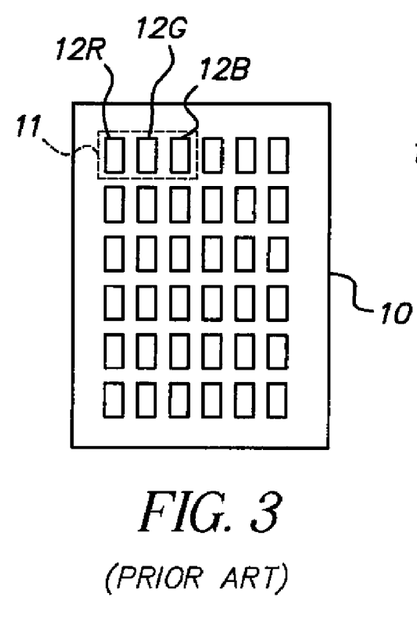
FIG. 3 is a top view of a three-color pixel layout on a substrate according to the prior art.

Referring to FIG. 3, in a prior art design, pixels 11 may comprise three patterned light-emitting elements or sub-pixels 12R, 12G, 12B, each patterned light-emitting element emitting light of a different color, for example red, green, and blue, to form a full-color display. In other designs, four-color pixels are employed, for example including a fourth white, yellow, or cyan light-emitting element. The present invention includes any patterned light-emitting device, regardless of design, layout, or number of light-emitting elements or colors of light-emitting elements and specifically includes displays having red, green, and blue sub-pixels and displays having red, green, blue, and white sub-pixels. As shown in FIG. 3, the light-emitting elements 12R, 12G, 12B are arranged in a stripe configuration such that each color of light-emitting element forms a column of light-emitting elements emitting the same color of light. In other designs, the light-emitting elements are arranged in delta patterns in which common colors are offset from each other from one row to the next row. Alternatively, four-element pixels may be arranged in two-by-two groups of four light-emitting elements. All of these different designs and layouts are included in the present invention.

As taught in the prior art, for example in manufacturing OLED devices, deposition masks may be made of metal and are reused multiple times for depositing evaporated organic materials. The masks may be cleaned but are, in any event, expensive, subject to thermal expansion, difficult to align, and problematic to clean. In particular, the present invention does not employ photolithographic methods of liquid coating, drying, patterned exposure forming cured and uncured areas, followed by a liquid chemical removal of the cured or uncured areas to form a pattern. In contrast, the present invention provides a very low-cost, single-use mask that is patterned while in place over the substrate, thereby overcoming the limitations of the prior art. The mask may be formed of flexible thin films of, for example, polymers, either transparent or non-transparent and is patterned in a completely dry environment, that is, no liquid chemicals are employed.

Figure 4A:
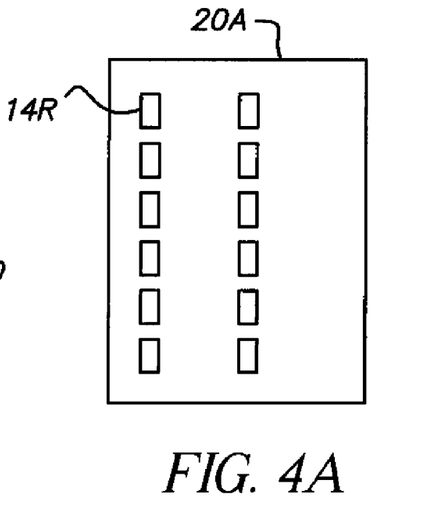
FIGS. 4A-C is a top view of three different mask films for depositing different materials on a substrate useful for the present invention.
Figure 4B:
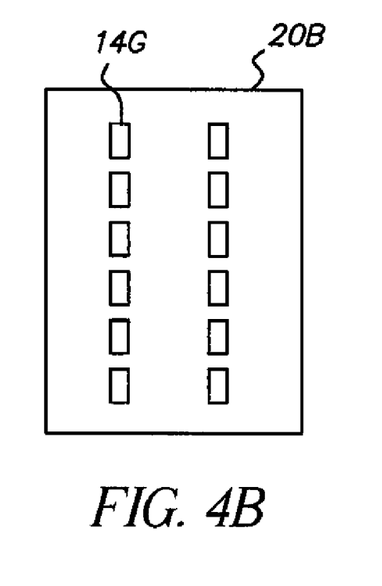
Figure 4C:
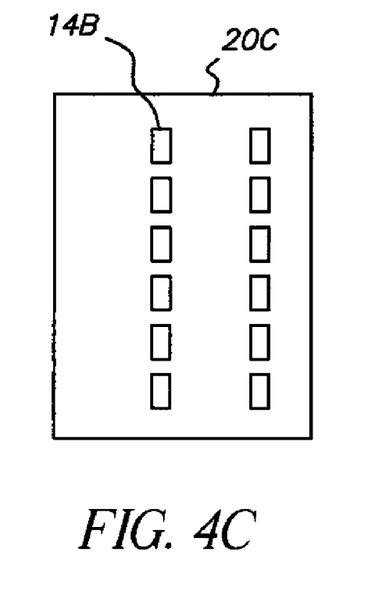

Referring to FIGS. 4A, 4B, and 4C, in one embodiment of the method of the present invention, three masks are successively employed. Each mask has openings in different locations that are referred to as "mask holes". Through out this application "mask holes" and "openings" in the mask are used interchangeably. Three different types of material are deposited through mask holes 14R, 14G, 14B in three different sets of locations corresponding to the light-emitting element locations 12R, 12G, and 12B in the layout of FIG. 3. In this embodiment, a first masking film 20A is firstly located over the substrate and the material in the patterned mask holes 14R in the masking film 20A is removed. Light-emitting material is then deposited through the mask holes 14R onto the corresponding substrate light-emitting element locations 12R; the first masking film 20A is subsequently removed. In a second series of steps, a second masking film 20B is secondly located over the substrate and the material in the patterned mask holes 14G in the masking film 20B is removed. Light-emitting material is then deposited through the openings 14G onto the corresponding substrate light-emitting element locations 12G and the second masking film 20B subsequently removed. The pattern in the first and second films may be different to expose different light-emitting areas. In a third series of steps, a third masking film 20C is thirdly located over the substrate and the material in the mask holes 14B in the masking film 20C is removed. Light-emitting material is then deposited through the mask holes 14B in yet another different pattern onto the corresponding substrate light-emitting element locations 12B and the third masking film 20C subsequently removed. At this stage, three different materials are patterned in three different sets of light-emitting element locations 12R, 12G, and 12B over the substrate to form a plurality of full-color light-emitting pixels. Any remaining processing steps necessary to form a complete device may then be performed. For example, an OLED device using patterned OLED materials may be employed in either a top- or bottom-emitter configuration. Note that the present invention may be combined with the unpatterned deposition of other layers to form a complete light-emitting device. Such unpatterned materials may include charge-injection layers, and charge-transport layers as are known in the organic and inorganic LED arts. Moreover, the areas of the mask holes 14 may be larger than the light-emitting areas 12. Since the light-emitting area 12 is typically defined by patterned device electrodes (not shown), it is only necessary to deposit material over the electrode areas corresponding to light-emitting elements 12. Additional material may be deposited elsewhere to ensure that deposition tolerances are maintained.

Figure 5:
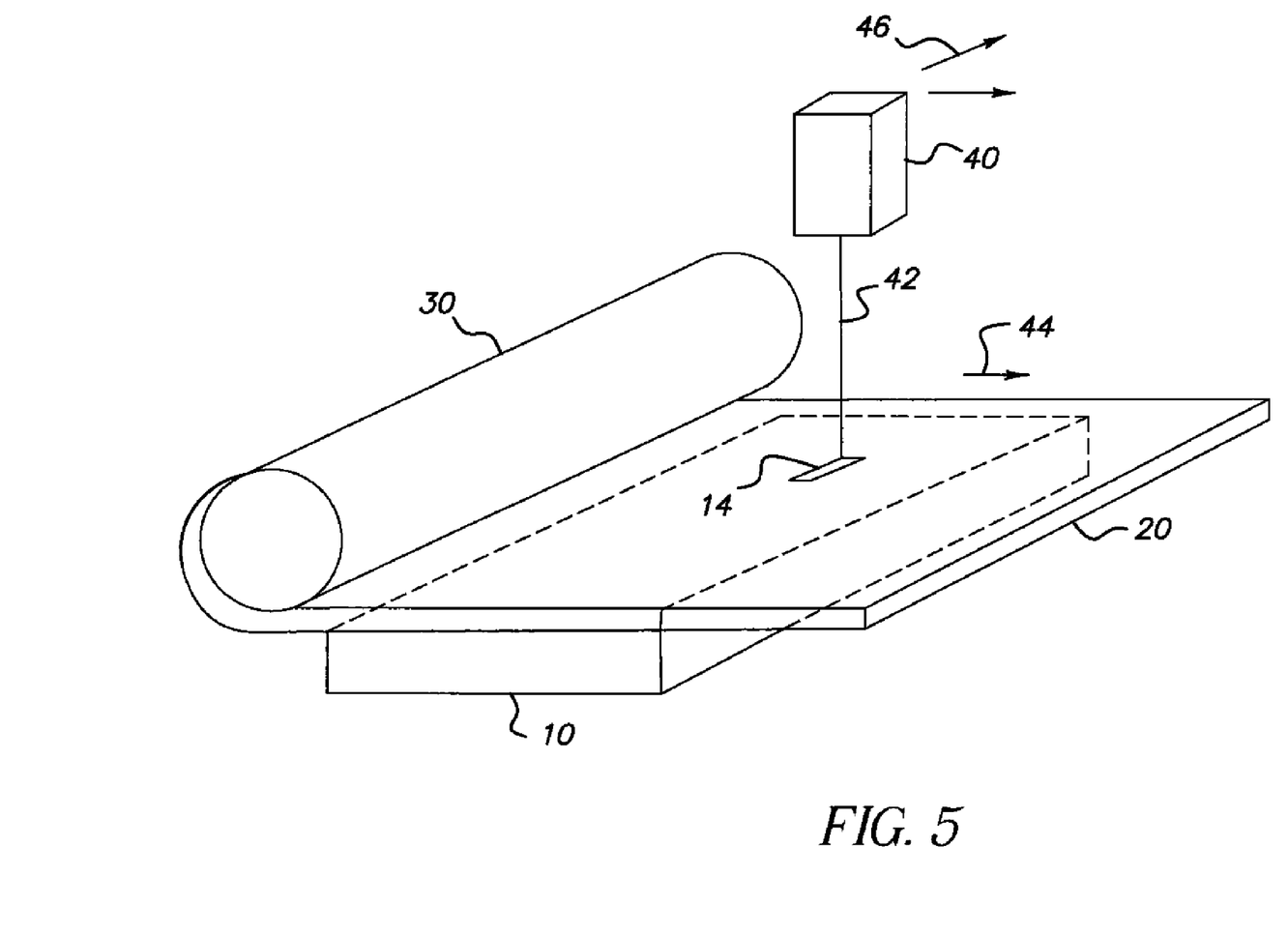
FIG. 5 is a three-dimensional view of a mask film roll, mask film, material ablation device, and substrate useful for the present invention.
Figure 6:
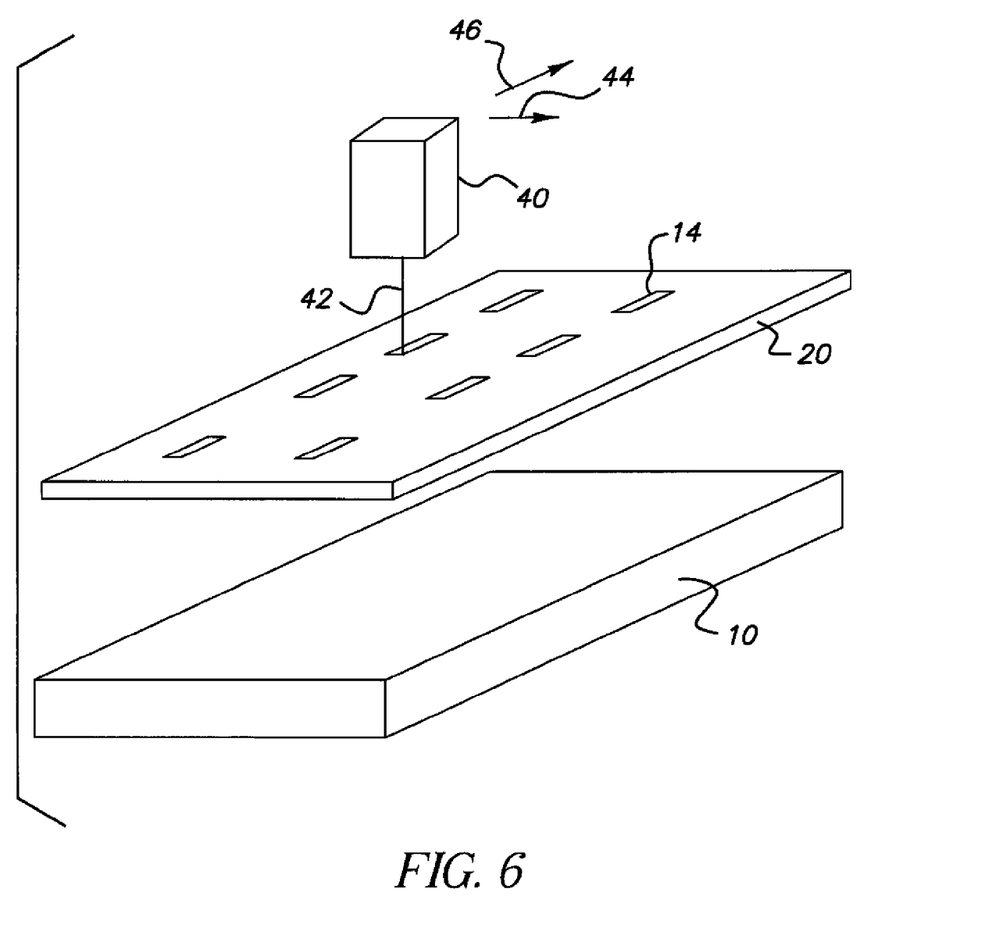
FIG. 6 is an exploded, three-dimensional view of a mask film, material ablation device, and substrate useful for the present invention.
Figure 9:
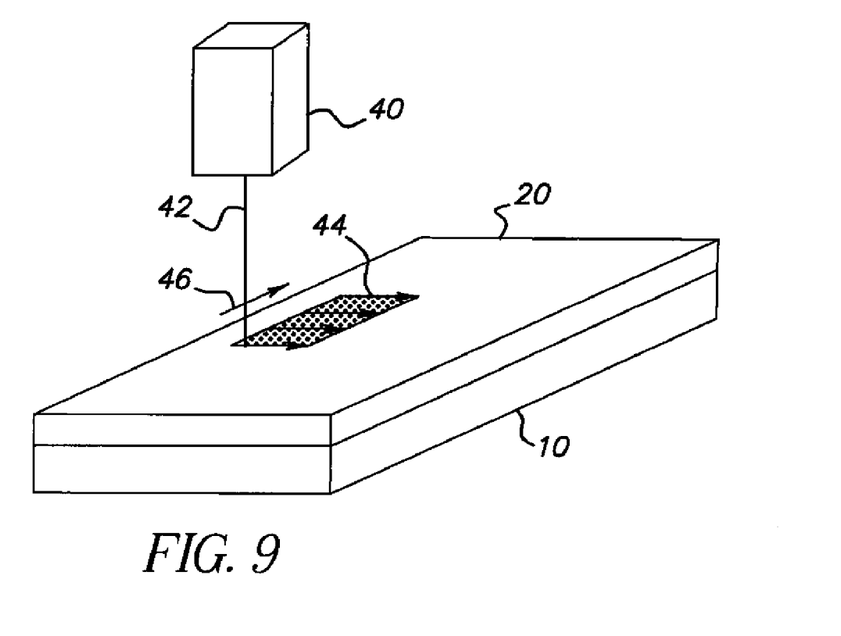
FIG. 9 is a three-dimensional view of a patterned mask film, scanning material ablation device, and substrate useful for the present invention.

In one embodiment of the present invention, the pattern may be formed in the masking film by removing the material from the location of the openings in the masking film. This may be done by heating the masking film material, for example by laser ablation, or by chemically treating the masking film. Referring to FIG. 5, a laser 40 emitting laser light 42 ablates the material in the mask hole openings 14 in masking film 20 over substrate 10. The laser light (or laser) is moved in orthogonal directions 44 and 46 to scan across the entire surface of the mask hole 14 and thereby ablate the material from mask hole 14. Alternatively, the substrate may be moved in one direction while the laser beam 42 scans in the orthogonal direction, thereby enabling a continuous process. The masking film 20 may be dispensed from a roll 30 of masking film material and located over the substrate 10. Likewise, when the masking film is removed, the material may be picked up on a second roller (not shown) as new masking film material is advanced from the roller 30. Rolls of films, mechanisms for moving and locating the films over a substrate, lasers, and mechanisms for scanning lasers over a surface are all known in the art. FIG. 6 illustrates a more detailed exploded view including the laser 40, laser light 42, the scan directions 44 and 46, the masking film 20 over the substrate 10, and a plurality of mask holes 14. FIG. 9 similarly illustrates the movement of the laser light 42 over the surface of the masking film 20 and the substrate 10 in orthogonal directions 44 and 46 to form mask hole 14.

While the masking film 20 itself need not be registered with the light-emitting areas 12 on the substrate 10, the mask hole openings 14 may correspond with the light emitting areas 12 and also be registered with them. Such registration may be aided by providing, for example, fiducial marks on the substrate. Such marks and the mechanisms for scanning lasers and ablating material to a necessary tolerance are known in the art, as are devices for collecting ablated material. Typical mask hole openings may be, for example, 40 microns by 100 microns in size.

Figure 7:
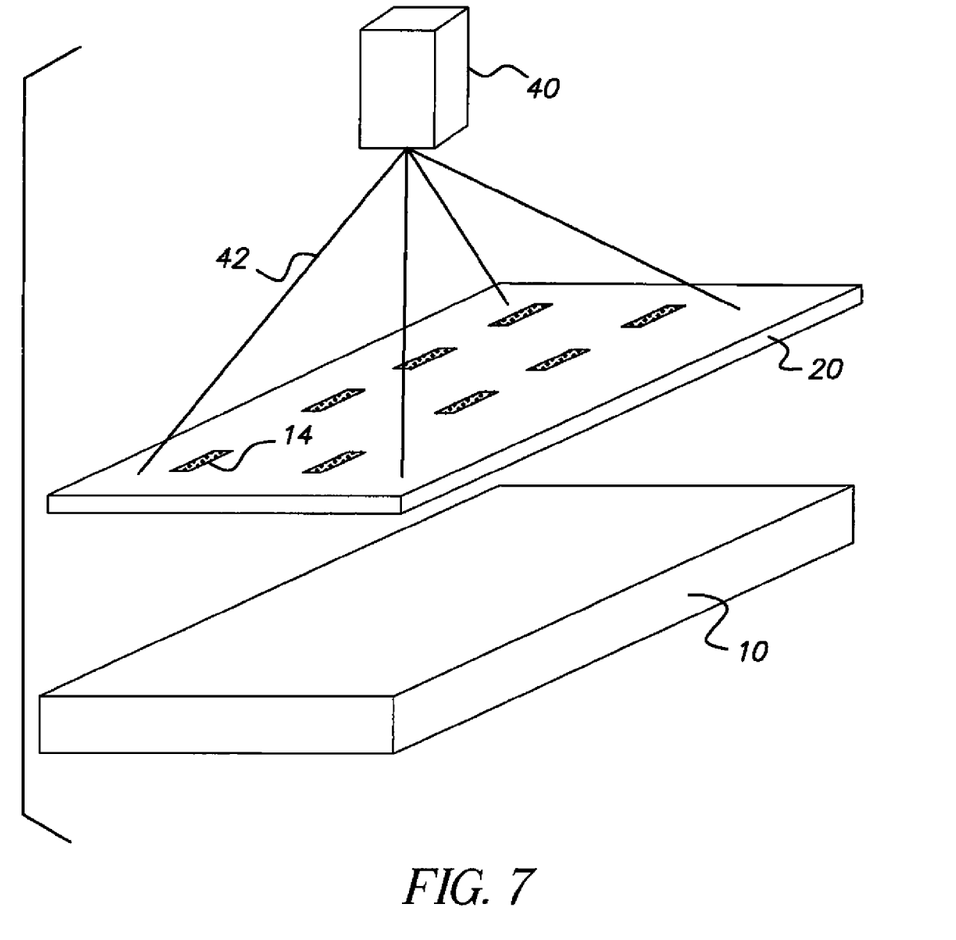
FIG. 7 is an exploded three-dimensional view of a patterned mask film, material ablation device, and substrate useful for the present invention.

While FIGS. 5 and 6 illustrate embodiments in which a laser beam 42 is scanned over the masking film 20 to remove masking film material and form mask hole openings 14, FIG. 7 illustrates an alternative approach. Referring to FIG. 7, the masking film 20 includes light absorptive areas adapted to selectively absorb laser light so that ablation only occurs in the light-absorptive areas. Light-absorptive areas, in the locations of the mask hole openings 14, may be formed by printing light-absorbing materials on the masking film, for example by inkjet or gravure processes, before or after the masking film 20 is located over the substrate 10. The light-absorptive areas correspond to the masking holes 14. In this way, the entire masking film 20 (or portions thereof) may be exposed at one time to ablate material in the light-absorptive areas, thereby increasing the amount of material that may be ablated in a time period and decreasing the amount of time necessary to form the mask hole openings 14 in the masking film 20.

Figure 10:
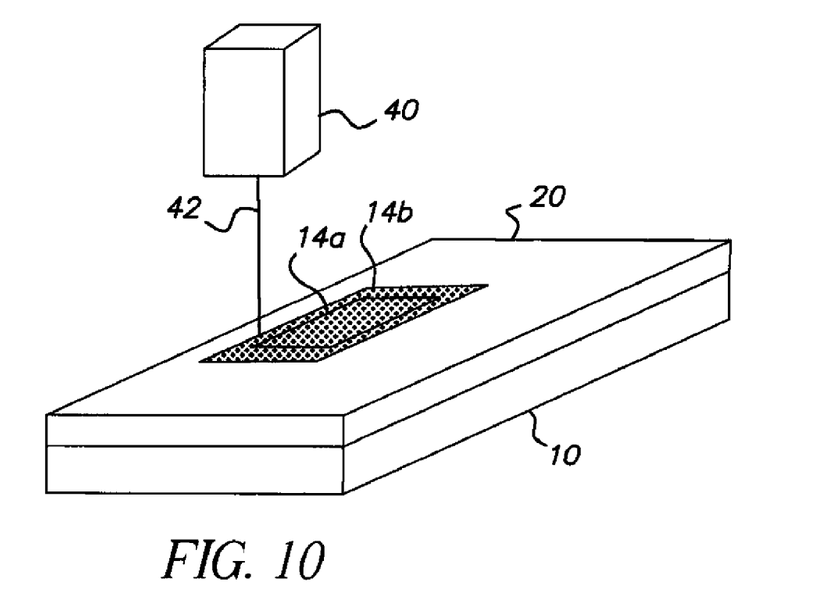
FIG. 10 is a three-dimensional view of a patterned mask film having a perimeter around a mask film opening, material ablation device, and substrate useful for the present invention.

In one embodiment of the present invention, the masking film material in the mask hole 14 may be ablated entirely. However, such an approach may have the disadvantage that particulate contamination may form on the light-emitting elements 12. In an alternative embodiment of the present invention, masking film material may be removed from around the perimeter of the mask holes 14. Referring to FIG. 10, the laser 40 scans laser light 42 around the perimeter 14b of the mask hole 14a so that the masking film material in the interior of the mask hole 14a is detached from the masking film 20. The detached masking film material, within the perimeter, may then be removed, for example by blowing a stream of gas over the surface of the masking film or by gravity (if the masking film 20 is below the substrate 10), thereby leaving the mask hole opening 14a free for subsequent deposition of light-emitting material.

Figure 11:
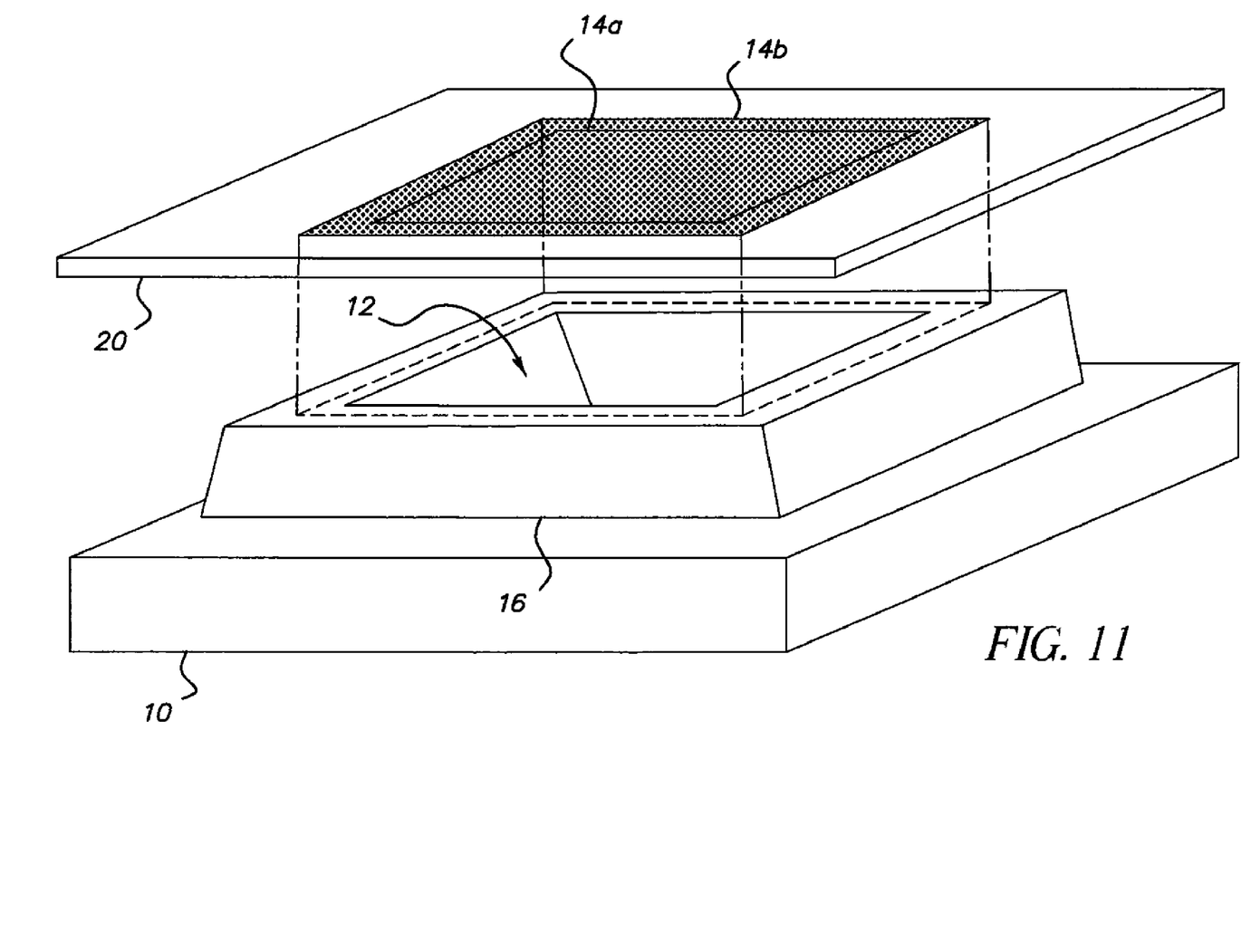
FIG. 11 is a three-dimensional view of a patterned mask film located over a substrate having raised areas useful for the present invention.

Referring to FIG. 11, in a further embodiment of the present invention, raised areas 16 may be formed over the substrate 10. Such raised areas can comprise, for example, photolithographic materials such as photo-resist or silicon dioxides or silicon nitrides formed on the substrate through photolithographic processes and may be, for example 20 microns to 50 microns wide, depending on the tolerances of the processes used to pattern the substrate electrodes or thin-film electronic components. The raised areas 16 may be located around a light-emitting area 12 and may be employed to insulate electrodes formed over the substrate 10. Such processes are well known in the photolithographic art and have been employed in, for example, OLED devices. The masking film 20 may be located over the substrate 10 and in contact with the raised areas 16. Laser ablation may be performed to remove the material from the mask hole 14 or to detach the mask hole material by ablating masking film material in the perimeter 14b of the mask hole 14. The remaining masking film material 14a is then detached. By employing a raised area 16, the masking film 20 is prevented from contacting the substrate 16 and any pre-existing layers located in the light-emitting areas 12.

As shown in FIG. 11, the mask hole perimeter 14*b* is located over the raised areas 16 (as shown by the dashed lines). In this embodiment, the laser light 42 is not directed into the light-emitting element area 12, thereby avoiding any problems that might result from exposing existing layers of material that may be already present in the light-emitting areas 12 (for example, inadvertent ablation of pre-deposited organic materials). Note that the area of the mask hole 14 may be larger than the light-emitting area 12. The illustrations of FIGS. 10 and 11 show the substrate 10 below the masking film 20, however, the positions of the substrate 10 and masking film 20 be reversed so that detached materials may fall away from the masking film 20, leaving the mask hole 14 open.

The detached mask hole material 14*a* may be removed in a number of ways. As noted above, gravity may be employed to allow the mask hole material 14*a* to fall away from the masking film 20 to form the mask holes 14. In yet another embodiment, a gas may be blown over the surface of the masking film 20 to remove the masking hole material 14*a* from the masking film 20. Alternatively or in addition, a vacuum device may be employed.

In alternative embodiments, a patterned surface may be employed to selectively remove the masking hole material 14*a*. For example, a surface having holes with negative gas pressure may be employed to suck the masking hole material 14*a* away from the masking film 20 to form the mask hole 14. Alternatively, the surface may be patterned with an adhesive, which will selectively adhere the masking hole material 14*a* to the patterned surface to enable the removal of the masking hole material 14*a* from the masking film 20 to form the mask hole 14. In yet another alternative embodiment, a patterned static charge may be employed on the surface to attract the masking hole material 14*a* from the masking film 20 to form the mask hole 14.

Figure 12:
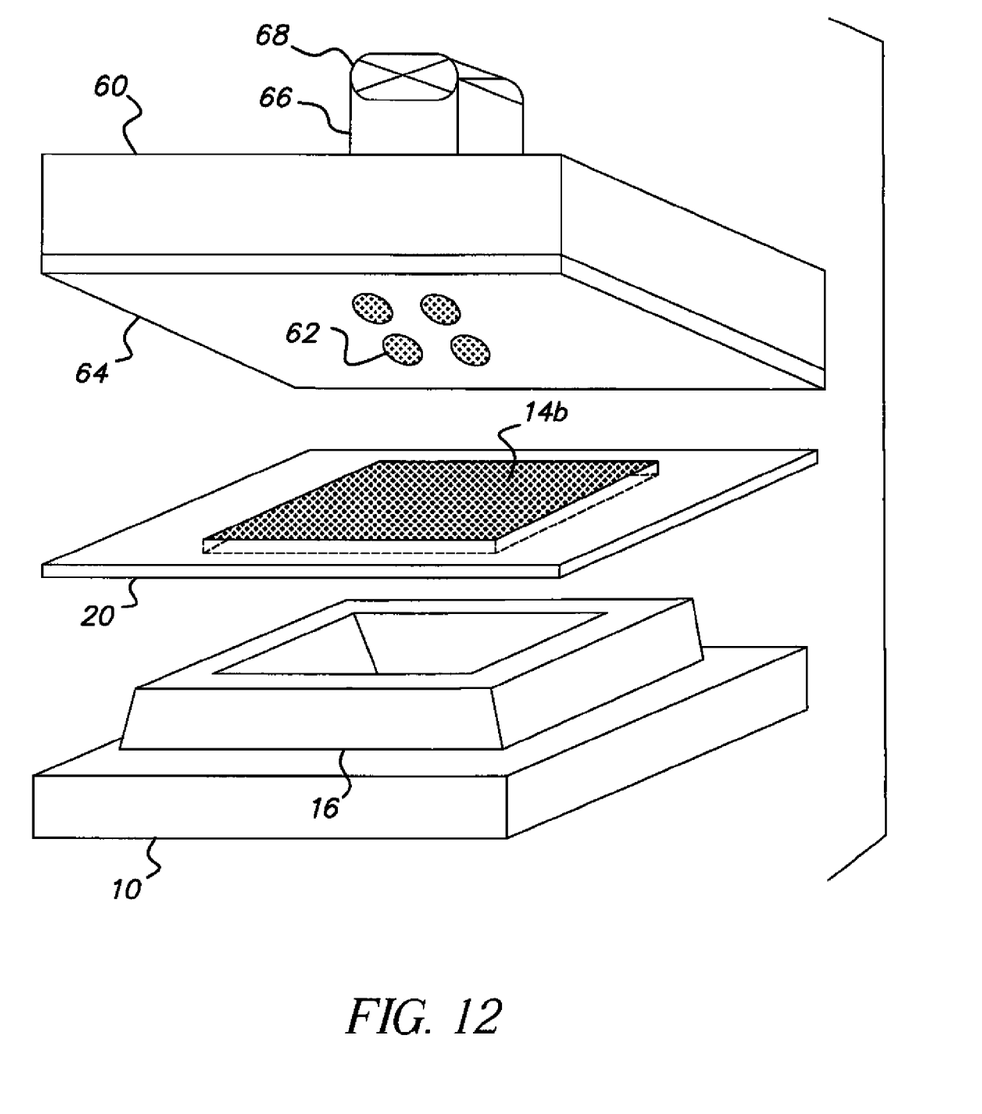
FIG. 12 is a three-dimensional view of a patterned mask film located over a substrate having raised areas, and a pressure chamber having holes useful for the present invention.

Referring to FIG. 12, in an alternative embodiment of the present invention, a surface 64 having a patterned location 61 is employed to remove mask hole material 14*a*. As shown in FIG. 12, a pressure chamber 60 may be provided to remove detached mask hole material 14*a* from within the perimeter of the mask holes 14. Pressure chamber 60 may comprise a hose 66 attached to a pressure reservoir through one or more control valves 68 for controlling the pressure within the pressure chamber 60. A surface 64, for example comprising a plate on the bottom (or top) of the pressure chamber 60, includes one or more holes 62. The plate may comprise, for example a rigid polymer or metal sheet and the holes mechanically drilled or photo-lithographically formed. The masking film 20 may be applied in a masking chamber having a gas atmosphere at a preferred pressure and the mask holes formed by ablating the perimeter 14*b* of the mask hole 14. Once the mask hole material has been detached from the masking film 20, the surface 64 may be located adjacent to, and possibly in contact with, the masking film 20. The pressure chamber 60 is then reduced in pressure through control valve 68. Gas is pulled into the pressure chamber through the holes 62 and the detached material is entrained by the gas movement or forced against the plate surface 64 in the locations of the holes by gas pressure. The pressure chamber 60 and surface 64 are then removed from the substrate 10, together with the detached mask hole material, but without the masking film 20, hence forming the mask hole openings 14. It is preferred that the holes 62 in surface 64 be patterned to correspond to the desired mask hole 14 locations, so that any force applied to remove the detached material not be applied in areas where no material is to be removed. The adhered masking film material may then be removed from the surface 64 by increasing the pressure in the chamber 60 and blowing the material away, for example into a disposal container.

In further embodiments of the present invention, the masking film 20 may be coated with a light adhesive on one or both sides of the masking film to assist in locating and maintaining the masking film 20 in registration with the substrate 10 and light-emitting areas 12. The adhesive may be located on the side of the masking film 20 that is in contact with the substrate 10 or raised areas 16. The adhesive may prevent, for example, the masking film 20 from moving with respect to the substrate 10 and may also serve to prevent detached masking film material from moving or falling into the light-emitting area 12, thus improving the detached material removal process. In another embodiment of the present invention, the surface 64 may adhere the masking film more readily to the substrate 10 or raised area 16 by pressing the masking film 20 down on the substrate 10 or raised areas 16 prior to forming the mask hole openings 14. Alternatively, other types of surface treatments may be employed.

It is also possible to employ other means to remove the detached masking film material, for example by employing a patterned adhesive. Patterned adhesives may be provided in many ways known in the art, for example by exposing an adhesive coating to patterned heat or light, or applied by patterning applicators such as gravure or inkjet applicators.

Figure 8:
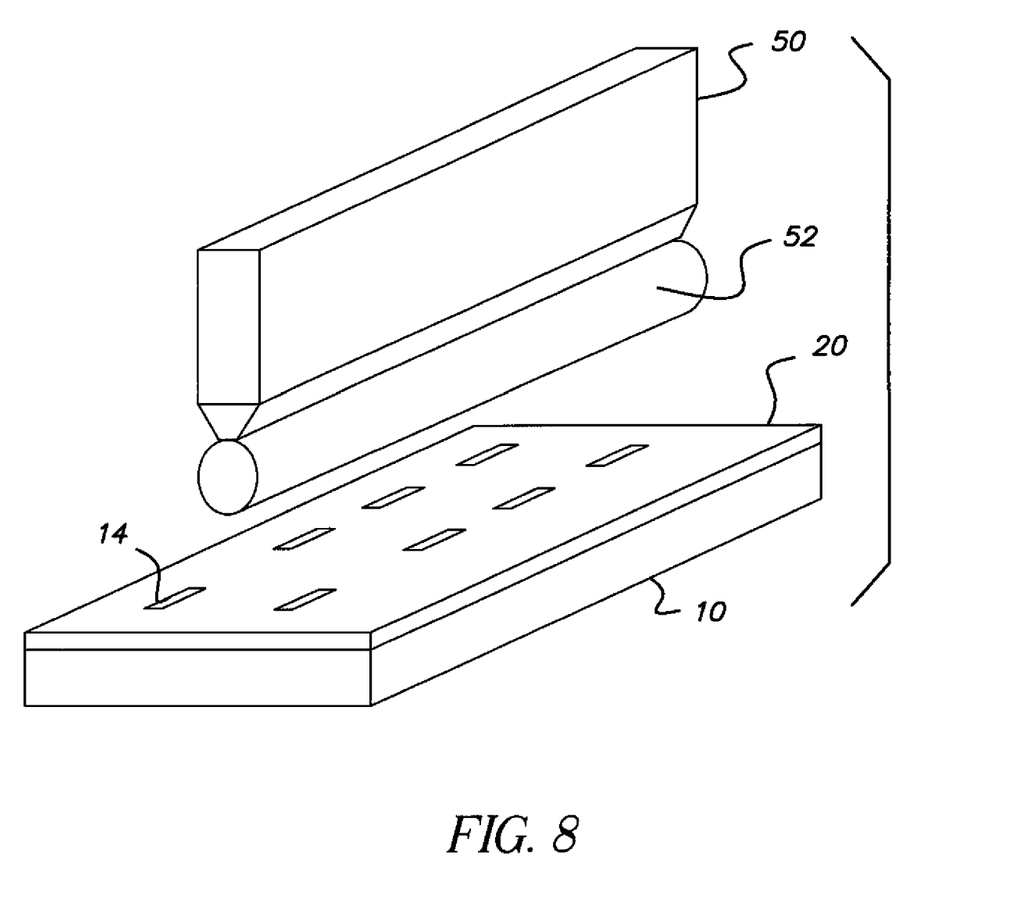
FIG. 8 is a three-dimensional view of a patterned mask film, material deposition device, and substrate useful for the present invention.

Referring to FIG. 8 once the mask hole openings 14 are formed in the masking film 20 in alignment with the light-emitting areas 12, light-emitting materials may be applied. In the case of small molecule OLED devices, the light-emitting materials are typically deposited by evaporation in a vacuum from a source, for example a linear source 50 that forms a plume of organic material 52 that is deposited through the mask holes 14 onto the substrate 10 in the locations of the light-emitters 12.

Figure 13:
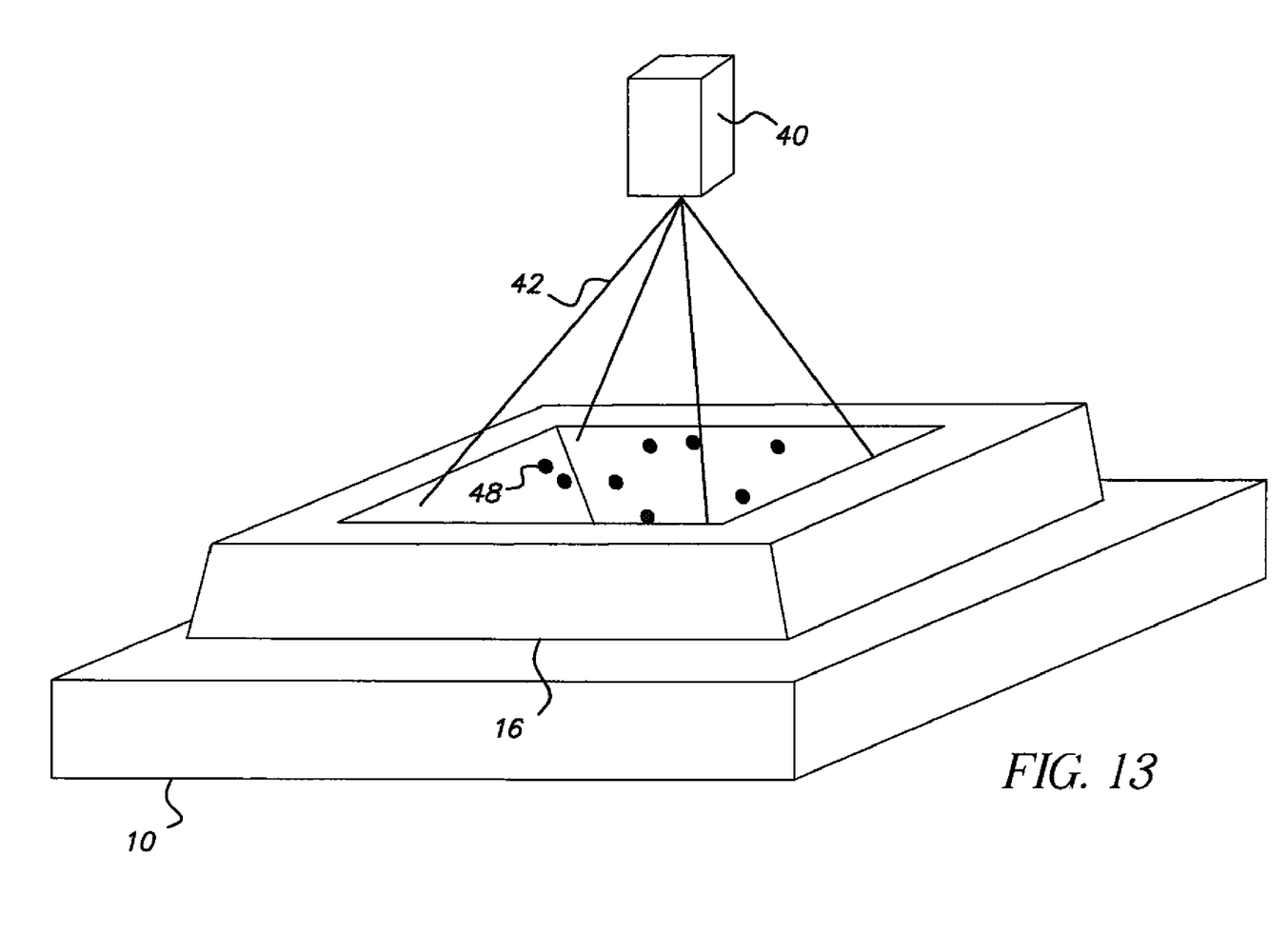
FIG. 13 is a three-dimensional view of contaminating particles within a light-emitting area, and an ablation device useful for the present invention.

Referring to FIG. 13, particulate contamination 48 deposited in the light-emitting areas 12 within a raised area 16 may be ablated as well, for example by a laser.

In summary, the method of the present invention may be employed to form, for example, a patterned, light-emitting device, comprising a substrate, light-emitting areas located over the substrate, and light-emitting materials pattern-wise deposited in the light-emitting areas through a masking film mechanically located over the substrate, the masking film having patterned openings formed while the masking film is located over the substrate and mechanically removed after the light-emitting materials are deposited. Hence, according to various embodiments of the present invention, a patterned, light-emitting device may be formed by first patterning the substrate with electrodes, active-matrix components, and the like, as is known in the display art. One or more unpatterned layers may also be deposited over the substrate. These steps may be performed in a vacuum. Subsequently, the substrate may be located in a masking chamber having an atmosphere, for example a nitrogen atmosphere. The first masking film is located over the substrate, the surface is used to adhere the masking film over the substrate, the mask holes are formed for a first pattern of light-emitting elements that emit a common color of light by detaching material from the masking film in locations corresponding to the first pattern, and the pressure chamber employed to remove the detached material and dispose of the detached material. The substrate may be detached from a masking film dispensing mechanism and removed from the masking chamber to a vacuum chamber and light-emitting materials deposited through the mask holes, for example by employing a linear source to deposit organic LED materials. The substrate is then returned to a masking chamber and the masking film removed. A second masking film is similarly provided and adhered and a second pattern of mask holes is formed. If the second pattern of mask holes is relatively aligned with the first pattern, the same surface having the same holes, but aligned to the second pattern, may be employed to remove the detached material. Since the patterns are typically highly structured and similar in pattern, the same surface and hole structure may be employed. The substrate is then removed, coated with different light-emitting materials in a vacuum through the second pattern of mask holes, returned to the masking chamber, and the second mask film removed. The third process proceeds likewise, resulting in a three-color light-emitting device. Any final un-patterned layers, for example an unpatterned electrode, may be applied and the device encapsulated.

The present invention provides many improvements over the prior art. The masking film may be inexpensive, for example comprising PEN or PET or other low-cost polymers provided in rolls. The film does not have to be repeatedly aligned with the substrate, as do traditional metal masks, nor do temperature dependencies arise, since the materials do not necessarily expand significantly in response to temperature; and if significant thermal expansion were to occur, the heat would only slightly decrease the area of the masking holes. If the masking holes are slightly oversized (as would be the case if a perimeter was ablated over a raised area), no effect on the formation of the light-emitting element would result. Because the film covers all of the substrate except those areas to be patterned with light-emitting materials, the substrate is protected from particulate contamination. Moreover, because a new film is provided for each deposition cycle, particulate contamination formed by removing masking film material may be removed when the masking film is mechanically removed. Employing a raised area around the light-emitting areas likewise prevents damage to any pre-existing light-emitting areas, as does ablating a perimeter over the raised areas around mask holes. In any ease, the masking film may be sufficiently thin that touching any delicate layers of, for example, organic materials, on the substrate may not damage the layers.

The present invention also provides a scalable means for manufacturing patterned light-emitting devices, since the masking film can be readily made in large sizes. Laser systems useful for ablating masking film materials may comprise many separate lasers, therefore enabling fast patterning. Such laser systems are known in the art. The use of a patterned plate to remove the detached material enables fast turnaround on arbitrarily large substrates. The patterned plate itself may be employed many times, without cleaning, reducing costs. Hence, the present invention can be employed in continuous processing systems, since the time-consuming steps (such as the mask hole formation) may be done in a continuous process while the provision and removal of the masking film requires relatively little time.

OLED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may also be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST 10 substrate
11 pixel
12 light-emitting element
12R red light-emitting element
12G green light-emitting element
12B blue light-emitting element
14 mask hole
14R opening in masking film for red light-emitter
14G opening in masking film for green light-emitter
14B opening in masking film for blue light-emitter
14a mask hole material within perimeter of mask hole
14b mask hole perimeter
16 raised area
20 20A, 20B, 20C masking film
30 roll of masking film
40 laser
42 laserlight
44, 46 direction
48 contaminating particles
50 linear source
52 plume of evaporated particles
60 pressure chamber
61 patterned location
62 hole
64 surface, plate
66 hose
68 control valve
100 provide substrate step
105 locate masking film step
110 form openings step
115 Deposit light-emitting materials step
120 remove masking film step
125 locate masking film step
130 form openings step
135 Deposit light-emitting materials step
140 remove masking film step

The invention claimed is:

1. A method of forming a patterned, light-emitting device, comprising the steps of:
 a) providing a substrate;
 b) providing a first masking film and then mechanically locating the first masking film over the substrate, and then sequentially performing the following steps c-i;
 c) forming first openings in first locations in the masking film;
 d) depositing first light-emissive materials over the substrate through the first openings in the first masking film;
 e) mechanically removing the first masking film;

f) providing a second masking film and then mechanically locating the second masking film over the substrate in a position that prevents particulate contamination in the first locations;
g) forming second openings in the second masking film, wherein the second openings are in different locations over the substrate than the first openings, wherein the first locations are protected from particulate contamination resulting from the formation of the second openings;
h) depositing second light-emissive materials over the substrate through the second openings in the second masking film; and
i) mechanically removing the second masking film.

2. The method of claim 1, further comprising the step of depositing evaporated materials over the substrate through openings in the first or second masking film.

3. The method of claim 1, wherein the light-emissive materials are organic materials comprising a small-molecule or polymer molecule light-emitting diode materials or inorganic light emitting particles.

4. The method of claim 1, wherein the steps of forming the first and second openings is performed through removal of the first or second masking film material in the location of the openings in the first or second masking film.

5. The method of claim 4, wherein the masking film material removal is accomplished through laser ablation of the first or second masking film material, heating the first or second masking film material, or chemically treating the first or second masking film material.

6. The method of claim 1, wherein the masking film material removal is accomplished through laser ablation of the first or second masking film material, heating the first or second masking film material, or chemically treating the first or second masking film material.

7. The method of claim 1, wherein the step of forming the first and second openings is performed through removal of the masking film material around the perimeter of the openings in the first or second masking film followed by the mechanical removal of the first or second masking film material within the perimeter of the openings.

8. The method of claim 7, further comprising mechanically applying a patterned surface to the first or second masking film material within the perimeter of the openings for removing excess first or second masking film material within the perimeter of the openings.

9. The method of claim 8, wherein the surface is patterned with holes, adhesive, or static charge.

10. The method of claim 9, wherein the step of forming the openings in the first or second masking film further sequentially comprises the steps of:

i) detaching the mask hole material from the first or second masking film by removing the masking film material around the perimeter of the openings in the masking film;
ii) locating the substrate and masking film in a gaseous atmosphere;
iii) providing a pressure chamber capable of evacuation having at least one surface with holes;
iv) aligning the pressure chamber surface holes with the opening in the first or second masking film and locating the pressure chamber surface with holes adjacent the first or second masking film;
v) reducing the pressure within the pressure chamber;
vi) removing the mask hole material from the first or second masking film by removing the pressure chamber to form the openings in the first or second masking film.

11. The method of claim 10, wherein the holes in the evacuation chamber are registered with the locations of the openings in the first or second masking film.

12. The method of claim 1, wherein the first or second masking film is visible-light absorptive.

13. The method of claim 1, wherein the first or second masking film includes a pattern of visible-light-absorbing materials located on or in the first or second masking film.

14. The method of claim 13, wherein the light-absorbing materials are printed on the first or second masking film.

15. The method of claim 13, wherein the first or second masking film is ablated in the areas of the first or second masking film having light-absorbing materials.

16. The method of claim 13, wherein the openings in the first or second masking film are formed by exposure to a patterned beam of light.

17. The method of claim 1, further comprising the step of removing particulate contamination from the openings in the first or second masking film.

18. The method of claim 17, further comprising the step of removing particulate contamination from the openings in the first or second masking film by laser ablation of particles in the openings.

19. The method of claim 1, further comprising the step of forming raised areas over the substrate on which the first or second masking film is located.

20. The method of claim 19, wherein the step of forming the openings is performed through removal of the first or second masking film material round a perimeter of the openings and the perimeter of the openings are located over the raised areas.

* * * * *